(12) United States Patent
Pathi et al.

(10) Patent No.: US 10,811,546 B2
(45) Date of Patent: Oct. 20, 2020

(54) PREPARATION OF ANTI-REFLECTION AND PASSIVATION LAYERS OF SILICON SURFACE

(71) Applicant: Council of Scientific & Industrial Research, New Delhi (IN)

(72) Inventors: Prathap Pathi, Delhi (IN); Rani Kalpana, Delhi (IN); Vandana, Delhi (IN); Sanjay Kumar Srivastava, Delhi (IN); Chandra Mohan Singh Rauthan, Delhi (IN); Parakram Kumar Singh, Delhi (IN)

(73) Assignee: Council of Scientific & Industrial Research (IN)

( * ) Notice: Subject to any disclaimer, the term of this patent is extended or adjusted under 35 U.S.C. 154(b) by 226 days.

(21) Appl. No.: 15/778,509

(22) PCT Filed: Nov. 22, 2016

(86) PCT No.: PCT/IN2016/050417
§ 371 (c)(1),
(2) Date: May 23, 2018

(87) PCT Pub. No.: WO2017/090059
PCT Pub. Date: Jun. 1, 2017

(65) Prior Publication Data
US 2018/0351010 A1   Dec. 6, 2018

(30) Foreign Application Priority Data
Nov. 23, 2015 (IN) .......................... 3817/DEL/2015

(51) Int. Cl.
*H01L 31/0216* (2014.01)
*H01L 31/18* (2006.01)
(Continued)

(52) U.S. Cl.
CPC .. *H01L 31/02168* (2013.01); *H01L 21/02189* (2013.01); *H01L 21/02205* (2013.01);
(Continued)

(58) Field of Classification Search
CPC ......... H01L 31/02168; H01L 31/02167; H01L 31/1804; H01L 21/02189; H01L 21/02205;
(Continued)

(56) References Cited

U.S. PATENT DOCUMENTS

| 4,842,888 | A | 6/1989 | Haluska et al. |
| 6,544,906 | B2 * | 4/2003 | Rotondaro ........ H01L 21/28185 438/785 |

(Continued)

FOREIGN PATENT DOCUMENTS

| EP | 1489667 A2 | 12/2004 |
| EP | 2413368 A2 | 2/2012 |

OTHER PUBLICATIONS

Wang et al., "Fabrication of sol-gel derived ZrO2 thin film for HR coatings via rapid thermal annealing process", Jun. 15, 2013, J Sol-Gel Sci Technol, vol. 67, pp. 339-343 (Year: 2013).*

(Continued)

*Primary Examiner* — Stephen W Smoot
*Assistant Examiner* — Sun Mi Kim King
(74) *Attorney, Agent, or Firm* — Lerner, David, Littenberg, Krumholz & Mentlik, LLP

(57) ABSTRACT

A process of depositing zirconium oxide ($ZrO_2$) layers possessing dual properties of anti-reflection and passivation of silicon surfaces, including passivation of n-type and p-type silicon substrates. To grow a $ZrO_2$ anti-reflection passivation layer, a precursor layer of zirconium oxide is spun on a silicon surface then dried, pyrolyzed and fired at suitable contact firing conditions, avoiding additional depo-
(Continued)

sition. Thermal annealing in a hydrogen environment improves passivation quality of $ZrO_2$ layer to a level 3-4 times higher than that of fired films alone. $ZrO_2$ dielectric passivation layers exhibit improved passivation quality after illumination due to photo-enhanced passivation and higher passivation quality at higher thermal budget suitable for screen printed metal contact firing, unlike standard PECVD deposited passivation layers. The method is adaptable for fabrication of silicon solar cells and other structures utilizing passivated layers.

10 Claims, 5 Drawing Sheets

(51) Int. Cl.
H01L 21/02 (2006.01)
H01L 31/028 (2006.01)
(52) U.S. Cl.
CPC .. *H01L 21/02282* (2013.01); *H01L 21/02318* (2013.01); *H01L 31/02167* (2013.01); *H01L 31/1804* (2013.01); *H01L 31/1864* (2013.01); *H01L 31/1868* (2013.01); *H01L 31/028* (2013.01); *Y02E 10/547* (2013.01); *Y02P 70/521* (2015.11)
(58) Field of Classification Search
CPC ......... H01L 21/02282; H01L 21/02318; H01L 31/1864; H01L 31/1868; H01L 31/028; Y02E 10/547; Y02P 70/521
See application file for complete search history.

(56) References Cited

U.S. PATENT DOCUMENTS

| 9,005,698 B2* | 4/2015 | Haider | H01L 27/20 |
| | | | 427/100 |
| 9,355,761 B2* | 5/2016 | Ma | H01B 19/04 |
| 2008/0220152 A1 | 9/2008 | Sharma | |
| 2013/0186460 A1 | 7/2013 | Chen et al. | |
| 2014/0182670 A1 | 7/2014 | Van Duren et al. | |

OTHER PUBLICATIONS

Lin et al., "Sol-gel preparation of nanostructured adsorbents", 1998, Studies in Surface Science and Catalysis, vol. 120, Elsevier Science, pp. 653-686 (Year: 1998).*
Aberle, A.G., "Surface Passivation of Crystalline Silicon Solar Cells: A Review", Progress in Photovoltaics: Research and Applications, vol. 8, Issue 5, Nov. 2000, pp. 473-487.
Agostinelli et al., "Very low surface recombination velocities on p-type silicon wafers passivated with a dielectric with fixed negative charge", Solar Energy Materials & Solar Cells, vol. 90, Apr. 2006, pp. 3438-3443.
Hoex et al., "Ultralow surface recombination of c-Si substrates assivated by plasma-assisted atomic layer deposited Al2O3", Applied Physics Letter, vol. 89, No. 4, Jul. 2006, pp. 042112-1-042112-3; Downloaded Jan. 17, 2020, https://doi.org/10.1063/1.2240736.
Ikeno et al., "Combinatorial Synthesis Study of Passivation Layers for Solar Cell Applications", Materials Science Forum, vol. 725, Trans Tech Publications Switzerland, Jul. 2012, pp. 161-164; doi:10. 4028/www.scientific.net/MSF.725.161.
International Search Report from Application No. PCT/IN2016/050417 dated Apr. 19, 2017, 3 pages.

* cited by examiner

PREPARATION OF ANTI-REFLECTION AND PASSIVATION LAYERS OF SILICON SURFACE

CROSS-REFERENCE TO RELATED APPLICATIONS

The present application is a national phase entry under 35 U.S.C. § 371 of International Application No. PCT/IN2016/050417 filed Nov. 22, 2016, published in English, which claims priority from Indian Patent Application No. 3817/DEL/2015 filed Nov. 23, 2015, all of which are incorporated herein by reference.

FIELD OF THE INVENTION

Present invention relates to a preparation of anti-reflection and passivation layers of silicon surface. Particularly, the present invention relates to a method of passivating crystalline silicon surfaces, similar to those used in silicon solar cells, using low-temperature solution based method. More particularly, the present invention relates to the deposition of a $ZrO_2$ layer that possesses dual properties of anti-reflection and passivation using low-cost method, lead to reduce manufacturing cost, with a feasibility of implementation in solar cell manufacturing process.

BACKGROUND OF THE INVENTION

The present R&D in silicon solar cell technology is driven to reduce silicon usage (gm/W) and thereby material cost in terms of reduction of solar cell thickness, leading to minimize the cost of the modules. As the thickness is reduced, there are two delicate challenges: optical confinement and minimization of electronic losses, limit the fabrication of high efficiency solar cells making use of thinner silicon wafers (A. G. Aberle et al., (Prog. Photovolt., Vol. 8, (2000) pp. 473). Presently, the conventional solar cells are made using ~180-200 $\mu$m thick wafers, however, 90% of energy is generated from the top 30 $\mu$m and the rest of the wafer is essentially required to support the device besides the generation of remaining amount of energy.

Wavelength dependent absorption coefficient of silicon leads to absorption of higher energy photons over a few tens of nano-meters of the silicon surface, while lower energy photons penetrate deep into the bulk. Therefore, charge carriers are uniformly generated across the wafer. Consequently, the photo-generated minority carriers either electrons (p-type Si) or holes (n-type Si) tend to recombine at the defects prevailing at silicon surfaces and the carriers generated in the vicinities of the two surface get recombined due to interface defect density. However, in thick wafers, the contribution of back surface is meagre. As the substrate thickness is reduced, electronic loss contribution from rear surface increases [Hwang et al., EP2413368A2].

Similarly, minimization of optical reflection losses is important to realize an efficient solar cell device. Several methods have been proposed over the past years to reduce the reflectance that can be obtained by optical confinement from silicon surfaces. Both anti-reflection coating (ARC) and passivation layer is essential for effective photons trapping and to minimize the surface (front and rear) recombination losses, respectively, in order to make efficient thin solar cell. This is usually realized using single of a combination of different dielectric layers such as SiN, $SiO_2$, $Al_2O_3$, etc., or their stacks.

Most of the currently known passivation and/or antireflection layers for silicon employ CVD and ALD, as given by B. Hoex, et al., (Appl. Phys. Lett., Vol. 89, (2006) pp. 042112) and G. Agostinelli et al., (Sol. Energy Mater. Sol. Cells, Vol. 90, (2006) pp. 3438), which involves high capital cost and suffers from low-throughput. Therefore, development of economic and cell processing compatible methods and materials is in demand for large-scale production of silicon solar cells. The anti-reflection and passivation schemes developed using solution methods, as described in this invention, are economical and upgradable at industrial level and the process has shown dual characteristics of passivation and anti-reflection. Wherein no capital investment is required besides it does not involve hazardous gases and chemicals. Therefore the process is eco-friendly.

$ZrO_2$ is a known dielectric material and has been synthesized by various methods for different applications. In the recent past, $ZrO_2$ has been developed using atomic layer deposition as well as solution methods for surface passivation of silicon, particularly.

Reference is made to M. Chen et al., (Patent application, No.: US 2013/0186460 A1), which discloses depositing a layer of $ZrO_2$ and its alloy of a thickness in the range, 1 Å-1 $\mu$m using ALD followed by forming gas (5% hydrogen and 95% nitrogen) annealing formed at 400° C. for 30 minutes. Bi-layer structure of $ZrO_2/Al_2O_3$ shows a passivation effect higher than the individual layer of either $ZrO_2$ or $Al_2O_3$.

Yet another reference is made to J. Hwang et al., (European patent application, No: EP 2 413 368 A2], which discloses the deposition of $ZrO_2$ layers using PECVD in order to passivate silicon surface. The dielectric passivation layers are charged either positive or negative using the "corona charging" process after the film deposition. In the corona process, the magnitude of charge can be controlled precisely.

Another reference is made to N. Ikeno et al. (Mater. Sci. Forum, Vol 725, (2012) pp. 161-164), wherein a binary alloy systems of $ZrO_2$—$Al_2O_3$ and $ZrO_2$—$Y_2O_3$ layers were studied as field effect passivation layer for crystalline Si solar cells. These binary systems were grown using combinatorial pulsed laser deposition method. For the systems of $ZrO_2$ incorporated with 20% $Al_2O_3$ and 15% $Y_2O_3$ annealed in oxygen ambience at 700° C. for 5 min improved the negative fixed charge of $-5.8\times10^{12}$ cm$^{-2}$ and $-7.8\times10^{12}$ cm$^{-2}$ respectively, suggesting that the alloy systems could be used for the passivation in the solar cell application.

Yet another reference is made to G. Agostinelli et al., (European patent application, No.: EP 1 489 667 A2], which discloses the deposition of a pseudo-binary oxide alloy of $(ZrO_2)_x(Al_2O_3)_{1-x}$ using spin-coating and processing at a higher thermal budget of 700° C. for 1 h. The two oxide layers should be non-stoichiometric in order to hold the fixed charge, which makes the process complicated. The effective surface recombination velocity as low as ~500 cm/s is achieved.

The drawbacks of the procedures disclosed in the above former two references [US 2013/0186460 A1 and EP 2 413 368 A2] are that it requires high-cost, ultra-high vacuum and complicated manufacturing equipments, and handling of hazardous and inflammable gasses. N. Ikeno et al. (Materials Science Forum, Vol. 725 (2012) pp. 161-164) reported the growth of binary alloy system using pulsed laser deposition, which has a limitation over a large area deposition and suffers from low-throughput besides the high thermal budget. The binary alloy systems impose several issues related to stoichiometry, which influence the fixed charge density and hence passivation quality.

Despite the process disclosed in the later reference [EP 1 489 667 A2] is economic, the process utilizes high thermal budget and the pseudo-binary oxide alloy/ternary oxide material that needs to be non-stoichiometric to achieve passivation of silicon surface, which limits the window of processing parameters in the following. The non-stoichiometry is generally very sensitive to the processing parameters and imposes several limitations on the physical characteristics of the layer and hence affects passivation quality. Wherein the present invention, we have developed a cell-process compatible method at lower thermal budget. On the contrary, the present invention deals with a binary $ZrO_2$ layer, which mitigates the stoichiometric issues, using low-cost solution method. Processing of $ZrO_2$ layer does not require large thermal budget. The spun layers get converted into dense $ZrO_2$ during following contact firing step. In other words, additional thermal treatment is not required to deposit/prepare antireflection passivation layers. The layers have shown better value of surface recombination velocity as low as 30 cm/s in a large window of thermal budget ranging from 650° C. to 750° C. Moreover, the layers are efficient on p-type as well as n-type silicon surface without any degradation in the antireflection and/or passivation characteristics at the thermal budgets suitable for contact firing (for single or co-firing).

OBJECTIVE OF THE INVENTION

The main object of the present invention is to provide a preparation of anti-reflection and passivation layers of silicon surface.

Another object of the invention is to provide an economically viable method for depositing zirconium oxide or zirconia ($ZrO_2$) layers having dual characteristics of anti-reflection and passivation of silicon at room temperature.

Yet another object of the present invention is to provide a method of depositing $ZrO_2$ layer that is compatible with the cell processing without affecting its anti-reflection and passivation quality on silicon that can be introduced in the existing manufacturing processes with minimal process modification.

SUMMARY OF THE INVENTION

Accordingly, present invention provides a process for surface passivation and anti-reflection of silicon surface using a dielectric layer deposited by a solution method, which is relatively low-cost, and eco-friendly in comparison to the known techniques. The process can be adopted directly in the existing solar cell fabrication process. Accordingly, $ZrO_2$ dielectric layers are deposited using spin-coating.

Accordingly, present invention provides a process for the preparation of anti-reflection passivation layers of silicon surface by coating ZrO2 layer and the said process comprising the steps of:
(a) providing $ZrO_2$ precursor solution using sol-gel method;
(b) depositing $ZrO_2$ precursor solution as obtained in step (a) on the front surface of silicon by spin coating;
(c) drying the spin-coated precursor layer at a temperature in the range of 70 to 200° C. for period in the range of 5 min to 30 min;
(d) repeating step (b) and step (c) on the rear surface of silicon;
(e) pyrolysing the precursor layers deposited on both surfaces at a temperature in the range of 350 to 450° C. for period in the range of 10 to 180 sec;
(f) firing of the pyrolysed layer at a temperature in the range of 650 to 750° C. for period in the range of 3 to 60 sec;
(g) post-firing anneal of the sample at a temperature in the range of 300 to 450° C. for period in the range of 10 min to 60 min to obtain antireflection passivation layer of silicon surface.

In an embodiment of the present invention, silicon surface is either having p-type or n-type conductivity.

Embodiments of the invention provide a method of depositing $ZrO_2$ dielectric layers on crystalline silicon wafers, which comprises of preparation of 'sol' for spin-coating, drying, firing and forming gas annealing.

In another embodiment of the present invention, $ZrO_2$ precursor is prepared by dissolving stabilizer in solvent and zirconium propoxide (ZP) wherein the volume ratio (V %) of solvent/stabilizer and solvent/ZP are in the range of 10-50 and 2-20 respectively.

In one embodiment of the present invention, the precursor solution of $ZrO_2$ was deposited on polished n-type silicon with <100> orientation employing the following steps.

Initially, as-cut silicon substrates were chemically polished and cleaned using standard procedures. A thin native oxide layer formed on silicon surface is removed using dilute HF (5%) solution.

In the following step, the prepared precursor of $ZrO_2$ was deposited on polished silicon using spin-coating at room temperature followed by drying, pyrolysis and firing.

In yet another embodiment of the present invention, the stabilizer used is selected from the group consisting of diethanolamine (DEA), ethyl acetoacetate, monoethanolamine or ethylene glycol.

In yet another embodiment of the present invention, the solvent used is selected from the group consisting of ethanol, methanol propanol or 2-methoxyethanol.

In yet another embodiment of the present invention, step (e) and (f) includes heating of the samples in $O_2$, $N_2$ or any other inert ambience.

In yet another embodiment of the present invention, thickness of $ZrO_2$ layer on silicon surface is in the range of 5 nm-500 nm.

In yet another embodiment of the present invention, step (g) includes post-firing anneal of the sample under the ambience of hydrogen or forming gas.

In yet another embodiment of the present invention, step (e) and (f) includes pyrolysis and firing annealing of precursor layers on both sides of silicon in a rapid thermal annealing system.

In yet another embodiment of the present invention, specific temperature profile is used for drying, pyrolysis and firing of the precursor layers, wherein temperature and time ranges are defined by steps (c), (e) and (f).

In yet another embodiment of the present invention, the Si—$ZrO_2$ layer having antireflection and surface passivation of either p-Si and/or n-Si.

In yet another embodiment of the present invention, step (b) includes dispensing a required amount of solution on silicon surface and spinning thereafter.

In yet another embodiment of the present invention, heating/drying of silicon with precursor layer at a temperature in the range of 70° C. to 200° C. for 5 min to 30 min.

In yet another embodiment of the present invention, heating of silicon with precursor layer to pyrolise organic moieties at a temperature in the range of 350° C. to 450° C. for 10 sec to 180 sec.

In yet another embodiment of the present invention, annealing of silicon with precursor layers on both sides of silicon at a firing temperature in the range of 650° C. to 750° C. for 3 sec to 60 sec.

In yet another embodiment of the present invention, step (e) and (f) includes annealing of silicon with precursor layers on both sides in a system like rapid thermal annealing system In yet another embodiment of the present invention, step (c), (d), (e) and (f) includes drying, pyrolysis and annealing of the sample using the process conditions (temperature profile) that are suitable for solar cell contact firing.

In yet another embodiment of the present invention, step (g) includes post-annealing treatment of the samples in the range of 300° C. to 450° C. for 10 min to 60 min.

In yet another embodiment of the invention, the spun film is dried in the temperature range, 70-200° C. for 10-60 min in any of the ambience, like atmospheric ambience, Ar, $N_2$, $O_2$ or any inert ambience.

In yet another embodiment of the invention, organic moieties present in the dried films were removed by pyrolising the layers at the temperature in the range of 350-450° C. in any of the ambience, like atmospheric ambience, Ar, $N_2$, $O_2$ or any inert ambience.

In yet another embodiment of the invention, curing of the layers was done at high temperature annealing (550-850° C.) for a short duration in the range of 2 sec to 60 sec using a specific temperature profile under $N_2$ ambience. In the present invention a rapid thermal annealing system was used for this purpose; however, an infrared belt furnace or similar system can also be used under $O_2$ or any inert ambience.

In another embodiment of the invention, the firing step is followed by an additional annealing in forming gas or hydrogen atmosphere in the temperature range, 300-450° C. for 10-60 min, which is used to form good Ohmic contacts, i.e., no additional step is going to be added in the cell fabrication process.

In one embodiment of the present invention, $ZrO_2$ layer thickness deposited on n-type Si is varied from 5 nm to 500 nm fired in the temperature range 550-850° C. followed by hydrogen annealing. This experiment was performed to evaluate the effect of thickness on the passivation and anti-reflection characteristics of the layer.

In yet another embodiment, the invention shows that the increased passivation effect after hydrogen annealing is due to the diffusion of hydrogen atoms to the $ZrO_2$/Si interface.

In a further embodiment of the present invention, p-type silicon wafers were passivated by $ZrO_2$ films using the method according to the first and second embodiments and processed using the method according to the third, fourth and fifth embodiments.

In an embodiment according to the present invention, recombination lifetime measured at different time intervals, in the range of 0-30 mins, showed an improvement in the lifetime values up to 35%. The cumulative flashes used for the measurement had a light soaking effect in terms of photo-enhanced passivation.

In yet another embodiment, the invention shows that the temperature profile used for the pyrolysis and firing of $ZrO_2$ films is suitable for the metal contact firing step that is required for cell fabrication at industry level, avoiding the requirement of additional thermal budget/process step for the deposition or processing of the antireflection passivation layers.

DETAILED DESCRIPTION OF THE INVENTION

Present invention discloses the innovative idea of employing solution processed (spin coating) dielectric zirconium oxide ($ZrO_2$) layers that result in a passivation and an antireflection coating on silicon surface at thermal budgets suitable for contact firing in conventional silicon solar cell processing, on the other hand, in the growth of $ZrO_2$ layer, a precursor layer of zirconium oxide is spun on silicon surface followed by drying and curing at the conditions suitable for contact firing. An additional thermal annealing step in hydrogen ambience is performed, which improved the passivation quality of $ZrO_2$ layer that 3-4 times higher than that of fired films alone. Cumulative measurement of effective minority carrier lifetime is found to be increased by 35% with time and get saturated after 15 s. The repetition of the cumulative measurement resulted in the similar trend. The process is compatible with the cell fabrication processes without any additional thermal annealing steps. However, the principle of the invention equally relates to any minority carrier device based on silicon.

The dielectric layer provides passivation of silicon surface by accumulating a charge of either type at the interface of $ZrO_2$/Si, shielding the minority carriers from the semiconductor interface by means of a built-in potential, known as field-effect passivation, or/and by reducing the interface defect density, known as chemical passivation.

The deposition method of $ZrO_2$ layers can be spin-coating, dip-coating or spray coating. Herein the present invention, spin-coating was used to produce $ZrO_2$ dielectric layers. This is a convenient and economically viable method to incorporate in the solar cell fabrication and is environmental friendly unlike the other known methods like chemical vapour deposition or atomic layer deposition. Albeit the present invention is discussed in a view of solar cells, it could not be limited to solar cells but could be adapted to other semiconductor based opto-electronic devices where passivation and/or anti-reflection is required.

Figure 1:
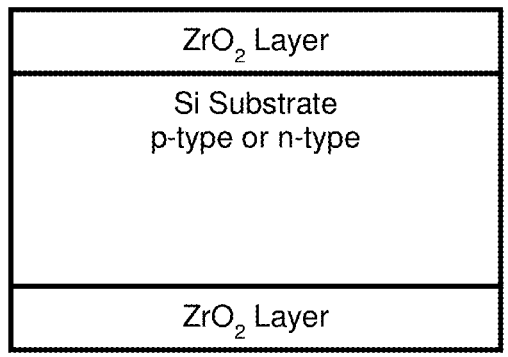
FIG. 1: Schematic of silicon wafer coated with $ZrO_2$ layers on both sides for the measurement of passivation quality

In the present invention, $ZrO_2$ layers were successfully grown on crystalline silicon wafers, using a precursor 'sol' as derived using the following steps, followed by spin-coating, drying, firing and hydrogen annealing. The schematic of $ZrO_2$ layers on front and rear surface of silicon is shown in FIG. 1.

Preparation of precursor sol: The preparation of 'sol' involves a mixture of solvent, stabilizer and solute in different ratios. In the present invention, diethanolamine (DEA) and ethanol ($C_2H_5OH$) were used as a stabilizer and solvent, respectively, while zirconium (IV) propoxide (ZP) was used as solute. The volume ratio of $C_2H_5OH/DEA$ ranges from 10 to 50, while $C_2H_5OH/ZP$ ranges from 2 to 20.

Figure 2:
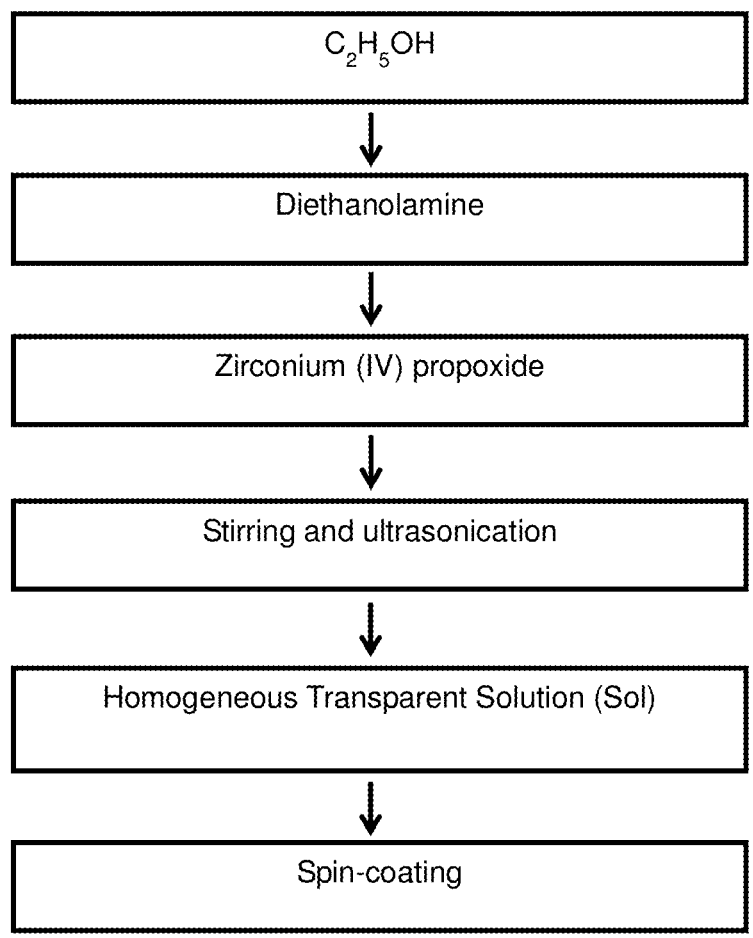
FIG. 2: Flow chart for preparation of 'sol' for the deposition of $ZrO_2$ films

The zirconia precursor solution was prepared by dissolving DEA in $C_2H_5OH$ and zirconium propoxide of required amount subsequently to the solution. Finally, solution was stirred for 2 hours to prepare homogeneous 'sol'. DEA was used as stabilizer in order to avoid precipitation or gelation of the solution during its application or storage. Further, it improves the film quality and process reproducibility. The "sol" prepared as mentioned, is stable for more than 12 months. Flow-chart of the experimental process for the synthesis of 'sol' required for $ZrO_2$ is shown in FIG. 2.

The prepared precursor solution of $ZrO_2$ could be deposited on silicon substrate using one of the methods, namely spray, dip-coating or spin-coating. However, in the present invention, the dielectric $ZrO_2$ layer was deposited using spin-coating. The growth of $ZrO_2$ layers on silicon substrates includes the following steps.

Preparation of silicon wafers: In a first step, as-cut silicon substrates with <100> orientation were etched to remove saw damages (~15 $\mu$m) from each side using standard etching solutions. In the following, the polished substrates were subjected to chemical cleaning process, which involves dipping of Si substrates in a mixture of $H_2O_2$ and $H_2SO_4$ in the ratio of 1:4 for 10 min at 80° C. As a result, the surface of silicon substrate is free of organic moieties and a thin native oxide is formed on the surface due to oxidizing nature of the chemicals. In the following step, such native oxide layers were removed using dilute HF (5%) solutions.

Deposition of $ZrO_2$ precursor layers: In a second step, the prepared precursor of $ZrO_2$ was deposited on polished and cleaned silicon substrate. For example, the films were spin-coated at room temperature at spinning speed ranging from 500 rpm to 5000 rpm followed by drying. The resultant thickness of $ZrO_2$ layer deposited on the substrate varied from 5 nm to 500 nm depending on the film deposition/processing conditions.

Figure 3:
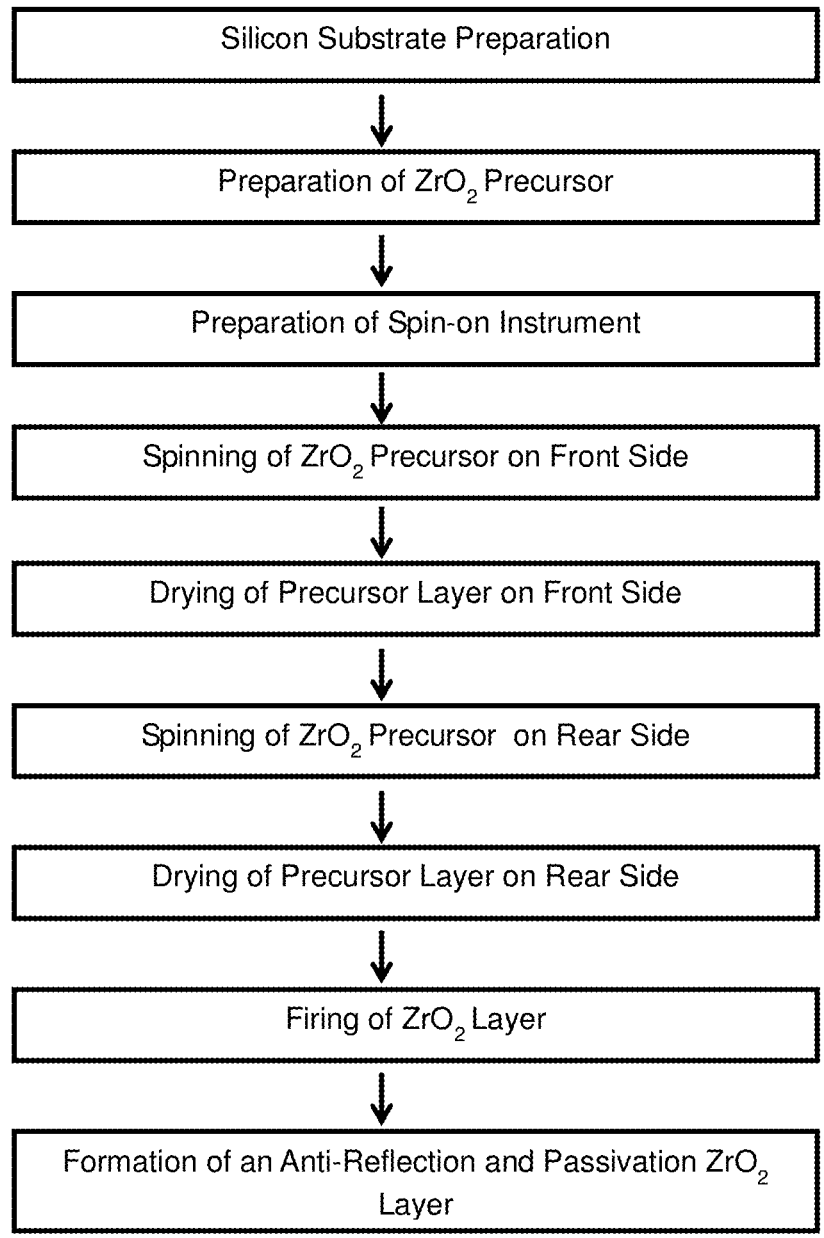
FIG. 3: Flow chart for the deposition of antireflection passivation $ZrO_2$ films on silicon substrates

Drying of coated layers: The deposited precursor layers were dried in an oven at a temperature in the range of 70-200° C. for 10-60 min in order to remove organic residual solvents, resulting in the formation of xerogel film. Flow-chart of the experimental process for the deposition of $ZrO_2$ layers on both sides of silicon substrates is shown in FIG. 3.

Pyrolysis of the precursor layer: The organic moieties were removed by pyrolysis of the layers at the temperature in the range of 350-450° C. for 10-300 sec in any of the ambience, like atmospheric ambience, Ar, $N_2$, $O_2$ or any inert ambience.

Figure 4:
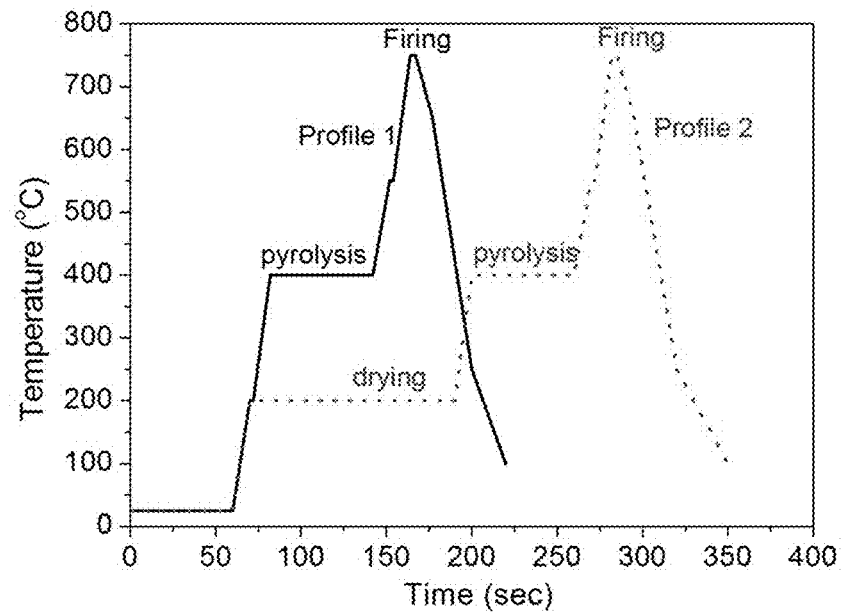
FIG. 4: Representative specific temperature profiles incorporating pyrolysis and firing (Profile 1) or drying, pyrolysis and firing (Profile 2) for the development of $ZrO_2$ layers.
Figure 5:
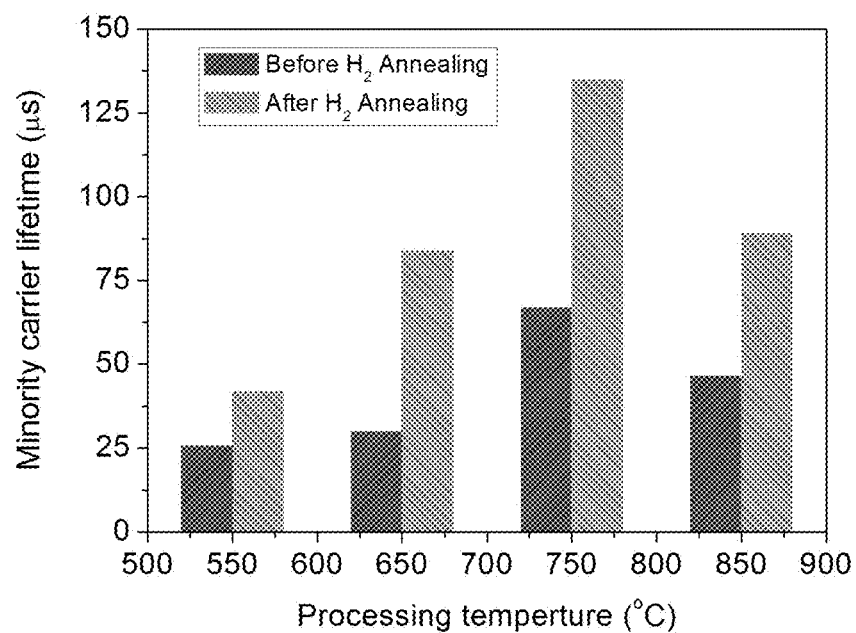
FIG. 5: Minority carrier lifetime of n-Si passivated on both faces with $ZrO_2$ layers fired at different temperatures and that of the hydrogen annealed samples. The thickness of $ZrO_2$ layers is ~45 nm. The lifetime reported in the figure is at the excess carrier density of $10^{15}$ $cm^{-3}$.

Firing of the precursor layer: Curing of the layers was performed using high temperature annealing (550-850° C.) for a short duration (2-60 sec) in a rapid thermal annealing system under $N_2$ ambience. This can also be achieved either in an infrared belt furnace or a similar system under the ambience of $N_2$, $O_2$, or any inert atmosphere. This step allows curing of the layers to get converted in to solid $ZrO_2$ layers. The temperature profile used for processing $ZrO_2$ layers is shown in FIG. 4. The high temperature treatment of xerogel film transforms the porous gel into a dense network as a result of viscous flow sintering. Effective minority carrier lifetime ($\tau_{eff}$) with injection level was measured using Quasi Steady-State Photo Conductance (QSSPC) method. FIG. 5 shows the effective minority carrier lifetime at an injection level of $10^{15}$ cm$^{-3}$ for the $ZrO_2$ layers fired at different temperatures in the range of 550-850° C.

Post-Firing Anneal of $ZrO_2$ layer: Accordingly, the firing step is followed by an additional annealing in a hydrogen atmosphere at a temperature in the range of 300-450° C. for 10 min to 60 min, suitable to forming gas annealing used to form good Ohmic contacts. The process of annealing in forming gas or $H_2$ ambience can passivate the dangling bonds present at the interface of $ZrO_2$/Si. This is accomplished by the diffusion of hydrogen atoms to the interface. FIG. 5 shows the effective minority carrier lifetime of hydrogen annealed samples in comparison to the layers, which are already fired at different firing temperatures of $ZrO_2$ layers in the range of 450-850° C.

Figure 6:
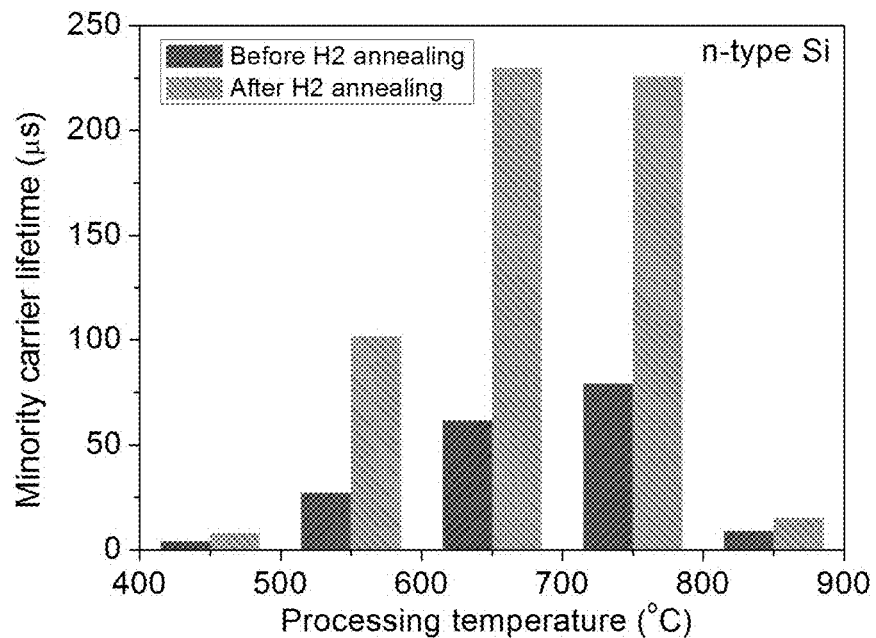
FIG. 6: Minority carrier lifetime of n-Si passivated on both faces with $ZrO_2$ layers fired at different temperatures and that of the hydrogen annealed samples. The thickness of $ZrO_2$ layers is ~80 nm. The lifetime reported in the figure is at the excess carrier density of $10^{15}$ $cm^{-3}$.
Figure 7:
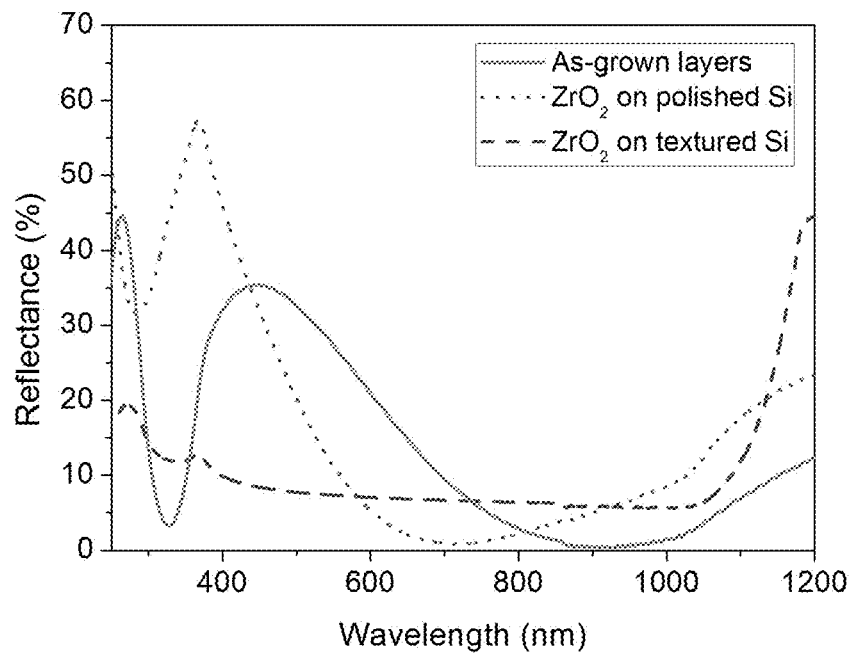
FIG. 7: Reflectance spectra of $ZrO_2$ layers (thickness ~80 nm) on to Si substrate before and after firing at 750° C. The reflectance minima shows considerable change in the film thickness, representing the densification of $ZrO_2$ layers due to firing. The layers on a textured silicon surface show reflectance below 6% over a wide range of wavelengths.

The firing temperature is in the range, 550-850° C. and is followed by hydrogen annealing. FIG. 6 shows the variation of minority carrier lifetime of fired samples at different temperatures and that of hydrogen annealed samples wherein a significant amount of improvement in the minority carrier lifetime is observed. FIG. 7 shows the anti-reflection characteristics of Si/$ZrO_2$ annealed at a particular firing temperature of 750° C.

It is an important feature to note that the passivation quality of hydrogen annealed $ZrO_2$ layers improved significantly in the firing temperature range, 650-750° C., which is suitable in the high temperature metallization steps like screen printing. The as-spun or dried $ZrO_2$ layers on silicon solar cell can be directly transferred to the screen printing followed by contact firing step at which the $ZrO_2$ layers get cured and converted into dense layer that acts as anti-reflection as well as passivation layer. Generally, CVD deposited passivation layers are known to be degraded severely in terms of passivation quality at the annealing temperatures above 350° C., which further demands low-temperature metallization step to in order to the retain the surface passivation quality. The low-temperature metallization involves lithographic process, which is not industry friendly for mass production. However, it is shown that the invented method can be employed as an anti-reflection and passivation scheme for p-Si as well as n-Si surface that is compatible at high-temperature processes as well. It is not a general feature in conventional processes and so has many advantages over the prior art. The high temperature stability and dual nature of $ZrO_2$ layers like passivation and antireflection have made it possible to incorporate the method in the fabrication protocols of different silicon solar cell structures.

Figure 8:
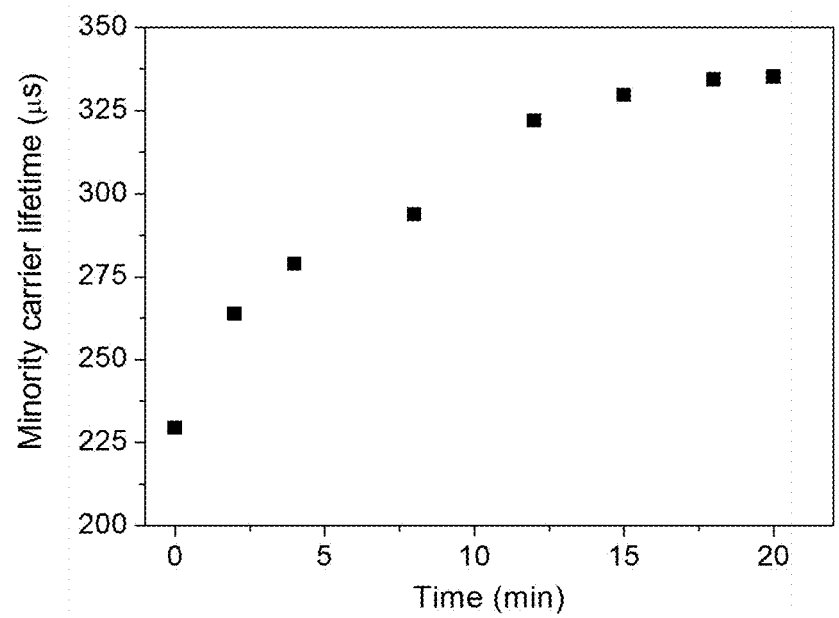
FIG. 8: Minority carrier lifetime of $ZrO_2$ coated (thickness ~80 nm) on to n-Si substrates measured at different time intervals cumulatively.

It is interesting to note that recombination lifetime measured at different time intervals in the range of 0-15 mins showed a progressive improvement wherein $\square_{eff}$ increased by 35% and its value gets saturated for more than 15 min as shown in FIG. 8. Accordingly, the cumulative flashes used for the measurement had a light soaking effect, i.e., photo-enhanced passivation. It is routinely observed that the repetition of the measurements with cumulative pulses on various samples on different consecutive days resulted in the similar phenomenon of enhancement in the minority carrier lifetime. This behavior would be an added advantage during the operational state of the solar cell modules.

Figure 9:
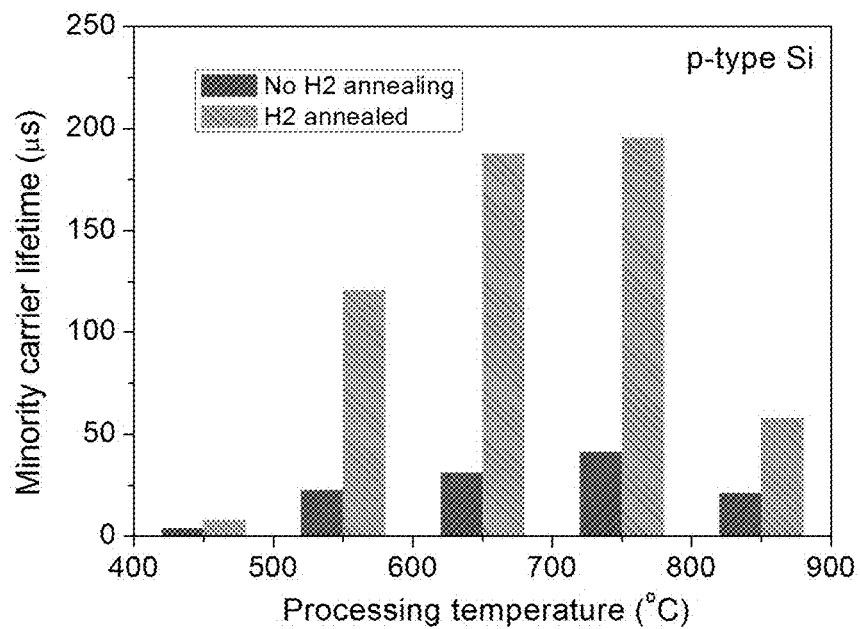
FIG. 9: Minority carrier lifetime of p-Si passivated on both faces with $ZrO_2$ layers fired at different temperatures and that of the hydrogen annealed samples. The thickness of $ZrO_2$ layers is ~80 nm. The lifetime reported in the figure is at the excess carrier density of $10^{15}$ $cm^{-3}$.

Further, p-Si wafers were also passivated by $ZrO_2$ films using the method according to the first and second embodiments and processed using the method according to the third and fourth embodiments. FIG. 9 shows the passivation quality of fired samples and that of hydrogen annealed ones, showing significant improvement in the temperature range, 650-850° C. for 2-60 sec.

The novelty of the present work is to provide an economic process for the deposition of layers that serves dual purpose of anti-reflection and passivation layers for silicon of both conductivity types with greatly improved performance. Further, at higher temperatures, no degradation in any of the two parameters is observed that provides a wide range window of the firing temperatures from 650° C. to 750° C. Also, the small thermal budget applied in the realization of antireflection and passivation characteristics of $ZrO_2$ layers is completely novel over the existing prior-art.

A higher passivation quality of $ZrO_2$ layers is observed over a large window of firing temperature in the range, 650-750° C. This is a very important feature to be noted in terms of achieving its passivation quality at the processing temperatures suitable for high temperature screen printing metallization step. In general, it is very critical to retain the passivation quality of PECVD deposited SiN or $SiO_2$ layers during the screen-printed metal contact firing step, at which considerable degradation is normally observed in standard cell fabrication process. In other words, no degradation in passivation quality of $ZrO_2$ layers is expected in the following cell processing steps.

The inventive steps in the present invention are deposition of $ZrO_2$ layers at room temperature and firing at sufficiently high temperatures, 650-750° C. that is suitable to contact firing temperatures (single or co-firing), at which the deposited layers (metal as well as the passivation layers) get converted into dense layers. This avoids high temperature deposition step or additional processing steps required for the growth of anti-reflection passivation layer. The thermal budget is very low and throughput is expected to be improved over the existing conventional processes.

EXAMPLES

The following examples are given by way of illustration only and should not be construed to limit the scope of the present invention.

Example 1

In the example, the structures used for the antireflection passivation analysis is shown schematically in FIG. 1, whereas the flowchart of the experimental process for the synthesis of 'sol' that is required for the grown of $ZrO_2$ layers is shown in FIG. 2. The precursor solution was prepared by dissolving zirconium (IV) propoxide (ZP) in ethanol (ETOH) and diethanolamine (DEA). Finally, solution was stirred for 2 hours to prepare homogeneous 'sol'. The ratios of ETOH/DEA and ETOH/ZP were maintained at 10 and 6.6, respectively. ETOH was used as a solvent DEA was used as stabilizer, which avoids precipitation or gelation of the solution, and also improves the film quality, uniformity and process reproducibility.

Example 2

The growth of $ZrO_2$ layers on silicon substrates includes the following steps. The flowchart of the experimental process for the deposition of $ZrO_2$ layers on both sides of silicon substrates is shown in FIG. 3.

In a first step, as-cut silicon substrates were polished using standard etching solutions and the substrates were subjected to standard chemical cleaning process. A thin native oxide is formed on the surface as a result of oxidizing nature of the chemicals, which was removed using dilute HF (5%) solutions.

In a second step, the prepared precursor solution of $ZrO_2$ was deposited on cleaned silicon substrates. For example, the films were spin-coated at 28° C. at spinning speed ranging from 2000 rpm for 10 sec. The layers were dried in an oven at a temperature of 200° C. for 10 min to remove organic residual solvents, forming xerogel film. Similarly, $ZrO_2$ films were deposited on rear-side of the substrate by repeating the 'second step'.

In the following, pyrolysis of the dried layers was done to remove organic moieties in the temperature range of 400° C. for 60 sec, followed by firing at high temperatures in the range of 550-850° C. for 2-60 sec in a rapid thermal annealing system under $N_2$ ambience. For example, the temperature profile used for the firing of $ZrO_2$ layers on silicon substrate at 750° C. is shown in FIG. 4. The high temperature curing step converts the porous gel into a dense network.

Accordingly, the firing step is followed by an additional annealing in a hydrogen atmosphere at a temperature in the range of 400° C. for 30 min.

Example 3

The passivation structures used for the analysis in example 3 is shown in FIG. 1. The method of fabricating/processing $ZrO_2$ layers on silicon is similar to that in example 1 and 2, while the difference lies in the thickness of the layers. Specifically, in one deposition, $ZrO_2$ layers of a thickness of 45 nm were deposited on both sides of silicon. The fired layers showed an optimum passivation quality in the firing temperature window of 650-750° C. The reported minority carrier lifetime ($\square_{eff}$) is at an injection level of $10^{15}$ $cm^{-3}$. Subsequently these films were annealed in $H_2$ or forming gas ambience at 350-450° C. for 10-60 min. For example, the films annealed at 400° C. for 60 min in $H_2$ ambience showed a significant amount of improvement in $\square_{eff}$ that is 2-3 times higher than that of fired films alone. Further firing above 750° C., the surface passivation is degraded as shown in FIG. 5, suggesting a temperature window for processing to retain the passivation characteristics of the structures. However, such a large window of 650-750° C. could enhance the possible conditions during the process steps following the surface passivation of silicon devices.

Example 4

The passivation structures used for the analysis in example 4 is shown in FIG. 1. The method of making $ZrO_2$ layers on n-Si is similar to that in example 3, while the difference lies in the thickness of the layers. Specifically, in another deposition, $ZrO_2$ layers of a thickness of 80 nm were deposited on both sides of the wafer. The fired layers showed an optimum passivation quality in the temperature window of 650-750° C. Moreover, the minority carrier lifetime is enhanced by a factor of 3 as the film thickness increased to 80 nm. Hydrogen or forming gas annealed films, for example at 400° C. for 60 min in $H_2$ ambience, showed a significant improvement in $\square_{eff}$ that is 3-4 times higher than the fired films alone. Firing temperatures above 750° C. degraded the surface passivation quality as shown in FIG. 6, suggesting a window for thermal budget to be applied. Therefore, the invention offers a large process window of processing parameters following contact firing steps at which optimum passivation quality of the processed layers could be achieved simultaneously. The $ZrO_2$ layers improved minority carrier lifetime in n-Si by 25 times at the optimum firing temperature.

Example 5

The antireflection passivation structures used for the analysis in example 5 is shown in FIG. 1. The method of fabricating/processing $ZrO_2$ layers on silicon is similar to that in the example 3, while the difference lies in the deposition of $ZrO_2$ layer on either single or both surfaces of silicon. The thickness of the $ZrO_2$ layer is similar to that in example 4. The reflectance spectra of as-grown layers (pyrolysed alone) and fired layers (at 750° C. for 3 sec) are shown in FIG. 7. The figure shows that the as-grown $ZrO_2$ layers (~100 nm) were densified (~80 nm) as a result of viscous flow sintering of porous layers at the high temperature annealing, i.e., firing step. The fired layers on silicon showed a minimum reflectance, $R_\square$ of <1% about a particular wavelength. Being single layer coating, only one minimum in the reflectance is observed, whereas surface texturization reduces $R_\square\square$ from ~35% to ~9% in a wide range of wavelengths (400-1100 nm) of solar spectrum. The $ZrO_2$ layers over the unoptimized textured silicon surface ($R_\square$ ~11%) showed the $R_\square$ below 6% in the wavelength range of interest for solar cells.

Example 6

The passivation structures used for the analysis in example 6 is shown in FIG. 1. The method of fabricating/processing $ZrO_2$ layers on silicon and its thickness is similar to that in the 'example 4', while the difference lies in the measurement of minority carrier lifetime. $ZrO_2$ layers processed on n-type silicon wafers showed improved $\square_{eff}$ measured cumulatively at different time intervals in the range of 0-15 mins wherein an improvement up to 35% is realized vis-à-vis the effective lifetime measured at single flash. The $\square_{eff}$ initially increased up to ~15 mins and gets saturated as shown in FIG. 8. The cumulative flashes used for the measurement induced a light soaking effect, i.e., photo-enhanced passivation. Similarly, lifetime measurement after 24 hours, the value of $\square_{eff}$ reduced to its original initial value of the single flash and its trend resembles the same with that of the cumulative measurement, indicating photo-enhanced passivation of $ZrO_2$ layers. Such phenomenon enhancement/trend in the $\square_{eff}$ is routinely observed on different consecutive days. This behaviour would be an added advantage during the operational state of the solar cell modules.

Example 7

The passivation structures used for the analysis in Example 7 is shown in FIG. 1. The method of fabricating/processing $ZrO_2$ layers on silicon and its thickness is similar to that in the 'Example 4', while the difference lies in the conductivity type of silicon substrate, which is p-type silicon (p-Si). The fired layers showed an optimum passivation quality in the temperature window of 650-750° C. The hydrogen or forming gas annealed films, for example at 400° C. for 60 min in $H_2$ ambience, showed a significant amount of improvement in $\square_{eff}$ that is more than 6 times higher than the fired films alone under $N_2$ ambience. The firing above 750° C. degraded the surface passivation quality as shown in FIG. 9, suggesting a window for thermal budget to be applied in the passivation step. However, the invention offers a large process window of processing parameters following firing steps at which optimum passivation quality of the processed layers could be achieved simultaneously. The $ZrO_2$ layers improved minority carrier lifetime in p-Si by 20 times at the optimum firing temperature.

Example 8

The passivation structures used for the processing of $ZrO_2$ layers in Example 8 is shown in FIG. 1. The method of depositing $ZrO_2$ layers on silicon and its thickness is similar to that in the Example 4 or 7, while the difference lies in the temperature profile used for the synthesis of the layers. The temperature profile, as shown in FIG. 4, is specific for the optimum annealing conditions which results in the high quality passivation that can be implied from FIGS. 5, 6 and 9. For example, the dried layers were pyrolysed at 400° C. for 60 sec followed by firing at 750° C. for 3 sec under $N_2$ ambience (FIG. 4) and it is proved to be the best processing condition at which $\square_{eff}$ is maximum though there is a large optimum firing window of 650-750° C. It is very advantageous that the temperature profile used for the pyrolysis and firing of $ZrO_2$ films is suitable for screen-printed metal contact firing step (usually, 600-750° C. for a few seconds), which is commonly required for cell fabrication at industry level. Since the high quality passivation layers are processed at the optimum conditions required for screen-printed metal contact firing, the $ZrO_2$ layers do not require additional thermal budget or processing step.

Advantages of the Invention

The main advantages of the present invention are as follows:
- The method of depositing $ZrO_2$ dielectric layers is cost-effective and does not involve high vacuum or expensive processing systems.
- The method of depositing $ZrO_2$ layers does not involve additional thermal budget that can be during the following contact firing step.
- The solution processed $ZrO_2$ dielectric antireflection passivation layers are efficient on p-Si as well as n-Si surface.
- The $ZrO_2$ dielectric passivation layers show improved minority carrier lifetime in p-Si by 20 times and 25 times in n-Si.

The method provides a large optimum process (firing) window of 650-750° C., which is very fabrication friendly.

The layers show a higher passivation quality at higher thermal budget suitable for screen printed metal contact firing unlike that of standard PECVD deposited passivation layers, i.e., no degradation of passivation quality is expected in the following cell processing steps.

The $ZrO_2$ dielectric passivation layers show a significant improvement in the passivation quality during the illumination.

The method does not impose any limit related with process compatibility, and the process is reproducible in terms of film thickness, passivation and anti-reflection as well.

The thermal budget applied is very low in comparison to the PECVD derived dielectrics and throughput is expected to be improved over the existing conventional processes.

Better passivation quality of passivation observed over a large window of processing conditions does not impose stringent conditions on the processing parameters, representing the independency of technological aspects of the instrument unlike that of other deposition systems like PECVD, ALD etc., which involves vacuum, RF or MW power, deposition temperature, etc.

The method of the invention is free of flammable gasses, hazardous chemicals as used in the prior art, hence the method is eco-friendly and safe in handling the precursor or processing equipment.

We claim:

1. A process for the preparation of anti-reflection passivation layers of silicon having front and rear surfaces by coating $ZrO_2$ layers and the said process comprising the steps of:
   (a) providing $ZrO_2$ precursor solution using sol-gel method;
   (b) depositing $ZrO_2$ precursor solution as obtained in step (a) on the front surface of silicon by spin coating to obtain a spin-coated $ZrO_2$ precursor layer;
   (c) drying the spin-coated $ZrO_2$ precursor layer obtained in step (b) at a temperature in the range of 70 to 200° C. for period in the range of 5 min to 30 min;
   (d) repeating step (b) and step (c) on the rear surface of silicon;
   (e) pyrolysing the spin-coated $ZrO_2$ precursor layers deposited on both surfaces at a temperature in the range of 350 to 450° C. for period in the range of 10 to 180 sec to obtain pyrolysed $ZrO_2$ layers;
   (f) firing of the pyrolysed $ZrO_2$ layers obtained in step (e) at a temperature in the range of 650 to 750° C. for period in the range of 3 to 60 sec to obtain $ZrO_2$ surface treated silicon;
   (g) post-firing annealing of the $ZrO_2$ surface treated silicon obtained in step (f) at a temperature in the range of 300 to 450° C. for period in the range of 10 min to 60 min to obtain antireflection passivation layers of said silicon surfaces.

2. The process as claimed in claim 1, wherein the front and rear silicon surfaces is either having p-type or n-type conductivity.

3. The process as claimed in claim 1, wherein $ZrO_2$ precursor solution in step (a) is prepared by dissolving stabilizer in solvent and zirconium propoxide (ZP) wherein the volume ratio of solvent/stabilizer and solvent/ZP are in the range of 10-50 and 2-20 respectively.

4. The process as claimed in claim 3, wherein the stabilizer used is selected from the group consisting of diethanolamine (DEA), ethyl acetoacetate, monoethanolamine or ethylene glycol.

5. The process as claimed in claim 3, wherein the solvent used is selected from the group consisting of ethanol, methanol, propanol or 2-methoxyethanol.

6. The process as claimed in to claim 1, wherein step (e) and (f) includes heating in $O_2$, $N_2$ or any other inert atmosphere.

7. The process as claimed in to claim 1, wherein thickness of $ZrO_2$ layers on silicon surfaces is in the range of 5 nm-500 nm.

8. The process as claimed in claim 1, wherein step (g) includes post-firing annealing in a hydrogen or forming gas atmosphere.

9. The process as claimed in claim 1, wherein step (e) and (f) includes pyrolysis and firing annealing of precursor layers on both sides of silicon in a rapid thermal annealing system.

10. The process as claimed in claim 1, wherein specific temperature profile is used for the drying, pyrolysis and firing identified by steps (c), (e) and (f), wherein temperature and time ranges are defined by steps (c), (e) and (f).

* * * * *